United States Patent
Curry

(10) Patent No.: US 9,689,582 B2
(45) Date of Patent: Jun. 27, 2017

(54) OVERVOLTAGE RECOVERY CIRCUIT AND A CONTROLLER AND HVAC SYSTEM INCLUDING THE SAME

(71) Applicant: Lennox Industries Inc., Richardson, TX (US)

(72) Inventor: Jimmie Curry, Carrollton, TX (US)

(73) Assignee: Lennox Industries Inc., Richardson, TX (US)

( * ) Notice: Subject to any disclaimer, the term of this patent is extended or adjusted under 35 U.S.C. 154(b) by 146 days.

(21) Appl. No.: 14/683,642

(22) Filed: Apr. 10, 2015

(65) Prior Publication Data

US 2016/0301203 A1  Oct. 13, 2016

(51) Int. Cl.
*H02H 3/00* (2006.01)
*F24F 11/00* (2006.01)
*F24F 11/02* (2006.01)
*H02H 3/06* (2006.01)
*H02H 3/20* (2006.01)
*H02H 9/04* (2006.01)
*H03K 17/082* (2006.01)

(52) U.S. Cl.
CPC ........... *F24F 11/001* (2013.01); *F24F 11/02* (2013.01); *H02H 3/066* (2013.01); *H02H 3/202* (2013.01); *F24F 2011/0052* (2013.01); *H02H 9/04* (2013.01); *H02H 9/041* (2013.01); *H03K 17/0822* (2013.01)

(58) Field of Classification Search
USPC ................................ 361/18, 86–87, 91.1, 92
See application file for complete search history.

(56) References Cited

U.S. PATENT DOCUMENTS

| | | | | |
|---|---|---|---|---|
| 3,311,907 A | * | 3/1967 | Teal | G01R 19/16538 327/576 |
| 6,031,705 A | * | 2/2000 | Gscheidle | H02H 3/202 361/111 |
| 7,561,395 B1 | * | 7/2009 | Hsieh | H02H 3/207 361/189 |
| 8,072,247 B1 | | 12/2011 | Wright | |
| 8,089,306 B1 | | 1/2012 | Wright | |
| 8,179,193 B1 | | 5/2012 | Wright | |
| 8,278,978 B1 | | 10/2012 | Wright | |
| 8,786,357 B1 | | 7/2014 | Wright | |
| 2004/0027757 A1 | * | 2/2004 | Minatani | B60L 3/0023 361/91.1 |
| 2012/0081816 A1 | * | 4/2012 | Mazzarisi | H02H 9/041 361/18 |
| 2015/0130622 A1 | * | 5/2015 | Scuka | H02H 3/207 340/635 |

* cited by examiner

*Primary Examiner* — Danny Nguyen
(74) *Attorney, Agent, or Firm* — Winstead PC

(57) ABSTRACT

An overvoltage recovery circuit (ORC), a controller for an HVAC system and an HVAC system are disclosed herein. In one embodiment, the ORC includes: (1) a first supply voltage terminal connected to a first voltage supply, (2) a second supply voltage terminal connected to a second voltage supply, (3) interruption circuitry including a switch and a trip terminal connected to the second supply voltage terminal and (4) detection circuitry connected to the first supply voltage terminal and the switch of the interruption circuitry, the detection circuitry configured to operate the switch in response to an overvoltage condition at the first supply voltage terminal.

16 Claims, 3 Drawing Sheets

OVERVOLTAGE RECOVERY CIRCUIT AND A CONTROLLER AND HVAC SYSTEM INCLUDING THE SAME

TECHNICAL FIELD

This application is directed, in general, to minimizing the effects of transient voltages on circuits, and more specifically, to minimizing the effects of transient voltages on the circuits of a controller or control board, such as for heating, ventilating and air conditioning (HVAC) systems.

BACKGROUND

A control board, such as in a controller for an HVAC system, can include multiple components and circuits that are rated to operate at a certain supply voltage or range of supply voltages. Often a control board will include a circuit or circuits that are designed to protect the components and circuits from sudden or momentary overvoltage conditions. One common cause of an overvoltage in circuits is electrostatic discharge (ESD). ESD is the transfer of an electrostatic charge between two objects (e.g., electronic devices) of different electric potential. Electronic devices, such as the controllers, often include overvoltage protection circuits to prevent damage when an overvoltage condition occurs.

SUMMARY

In one aspect, the disclosure provides an overvoltage recovery circuit (ORC). In one embodiment, the ORC includes: (1) a first supply voltage terminal connected to a first voltage supply, (2) a second supply voltage terminal connected to a second voltage supply, (3) interruption circuitry including a switch and a trip terminal connected to the second supply voltage terminal and (4) detection circuitry connected to the first supply voltage terminal and the switch of the interruption circuitry, the detection circuitry configured to operate the switch in response to an overvoltage condition at the first supply voltage terminal.

In another aspect, the disclosure provides a controller for a HVAC system. In one embodiment, the controller includes: (1) a power supply, (2) a hardware watchdog coupled to the power supply and (3) an overvoltage recovery circuit (ORC) connected to the power supply, the ORC including: (3A) a first supply voltage terminal connected to a first voltage supply, (3B) a second supply voltage terminal connected to a second voltage supply, (3C) interruption circuitry including a switch and a trip terminal connected to the second supply voltage terminal and (3D) detection circuitry connected to the first supply voltage terminal and the switch of the interruption circuitry, the detection circuitry configured to operate the switch in response to an overvoltage condition at the first supply voltage terminal.

In yet another aspect, the disclosure provides an HVAC system. In one embodiment, the HVAC system includes: (1) a heating source or a cooling source and (2) an HVAC controller configured to direct operation of the heating source or the cooling source, the HVAC controller including: (2A) a processor configured to provide control signals for components of the HVAC system and provide an interrupt signal to initiate a reset thereof, (2B) a hardware watchdog configured to receive the interrupt signal from the processor and interrupt power to the processor in response thereof, and (2C) an overvoltage recovery circuit (ORC) having a first supply voltage terminal connected to a first voltage supply, a second supply voltage terminal connected to a second voltage supply, interruption circuitry including a switch and a trip terminal connected to the second supply voltage terminal and detection circuitry connected to the first supply voltage terminal and the switch of the interruption circuitry, the detection circuitry configured to operate the switch in response to an overvoltage condition at the first supply voltage terminal.

BRIEF DESCRIPTION

Reference is now made to the following descriptions taken in conjunction with the accompanying drawings, in which.

DETAILED DESCRIPTION

The overvoltage protection circuits are designed to protect devices from being damaged due to high voltage conditions, such as ESD. It is realized herein, however, that the protection circuits are not designed to address the operation of the devices or components thereof after an overvoltage event. For example, an HVAC controller may include a display or another user interface that is protected by an overvoltage protection circuit. After the overvoltage event, however, the display needs to be reset to properly operate.

Accordingly, disclosed herein is an overvoltage recovery circuit (ORC) that is configured to automatically reset components after an overvoltage event. As such, the effected components do not have to be manually reset. The ORC is not used to protect circuits from overvoltage conditions but instead is used in the recovery of components after overvoltage events. The ORC can be used with overvoltage protection circuits to provide both protection and recovery from overvoltage events. As such, the ORC can be used with overvoltage resistant devices, such as, an ESD resistant device. ESD resistant devices are devices or components that are typically tested to IEC61000-4-2 Level 4, ±8 kV Contact Discharge.

An ORC can be used to reset a particular component or multiple components. As such, an ORC can be used to reset various types of components; especially those types of components who do not generate their own interrupt signal to a reset device (e.g., a hardware watchdog). In some embodiments, an ORC can be used with controllers to protect components thereof. For example, an ORC can be used with an HVAC controller.

Figure 1:
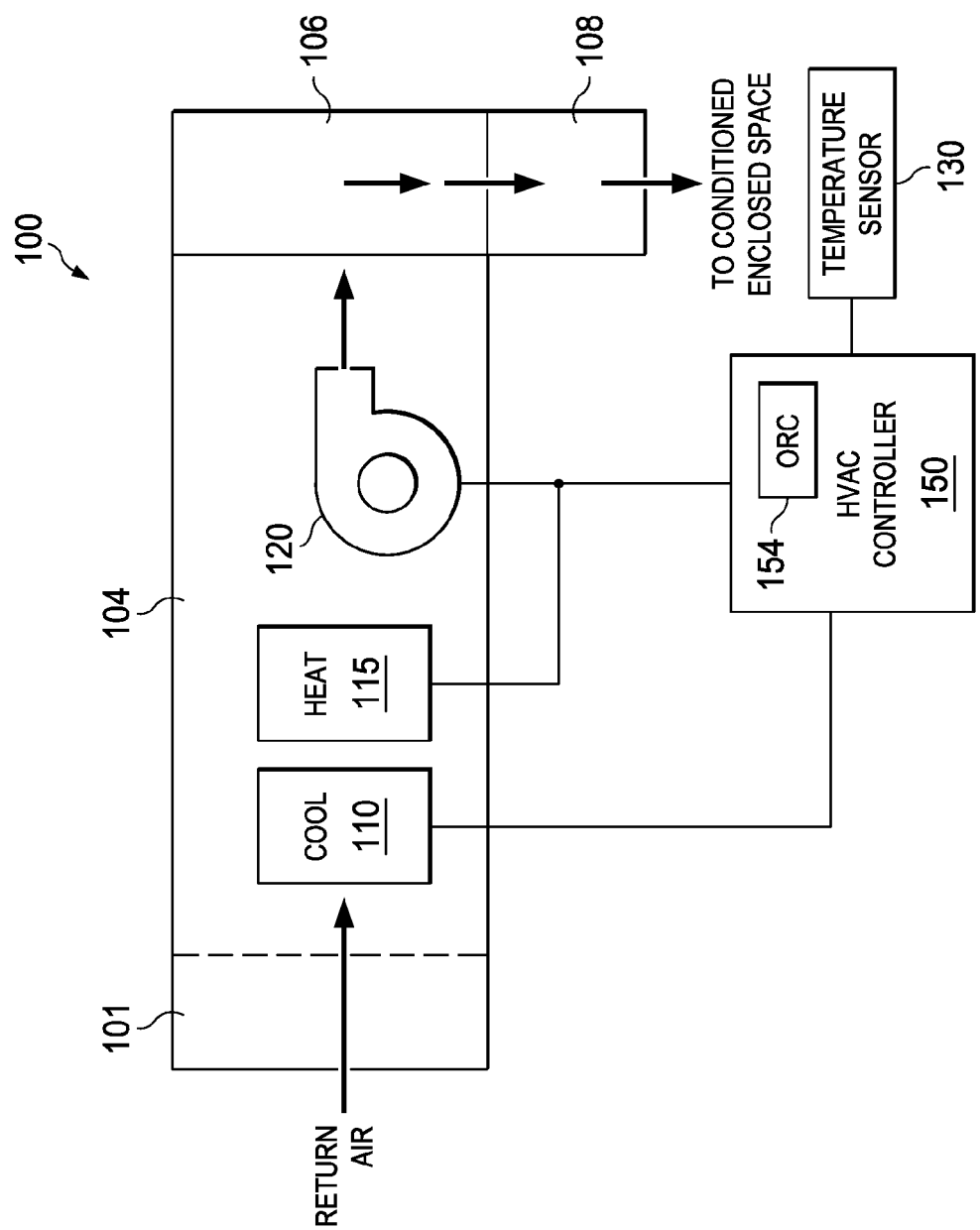
FIG. 1 illustrates a diagram of an embodiment of a HVAC system constructed according to the principles of the disclosure.

Turning now to FIG. 1, illustrated is a block diagram of an embodiment of a HVAC system 100 constructed according to the principles of the disclosure. The HVAC system 100 includes a return duct 101, a return plenum 104, a supply duct 106 and a supply plenum 108. Additionally, the HVAC system 100 includes conditioning systems for cooling and heating air in the enclosed space. The conditioning systems include a cooling system or cooling source 110 and a heating system or heating source 115. The cooling system 110 can include a refrigeration circuit having a compressor system, evaporator coils and condenser coils fluidly coupled together. The cooling system 110 can have multiple cooling stages or can be a single cooling stage system. The heating system 115 can include a gas furnace, electric heating elements, or even a combination thereof. The heating system 115 can also be multi-staged or a single staged system.

The HVAC system 100 also includes a circulation fan 120, a temperature sensor 130 and an HVAC controller 150. One skilled in the art will also understand that the HVAC system 100 may include additional components and devices that are not presently illustrated or discussed but are typically included in an HVAC system, such as, a humidity sensor, a filter, a power supply, etc. Some of the illustrated components of the HVAC system 100 may be contained within a single enclosure (e.g., a cabinet). In one embodiment, the HVAC system 100 is a rooftop unit. The HVAC system 100 can be another type of commercial HVAC system or a residential system.

The temperature sensor 130 is configured to sense the temperature within the enclosed space and send the sensed temperature to the HVAC controller 150. The HVAC controller 150 receives the sensed temperature and directs operation of the HVAC system employing the sensed temperature input. The temperature sensor 130 can be a thermostat that senses temperature, receives user inputs, and generates thermostat calls. The cooling system 110, the heating system 115, the circulation fan 120, and the temperature sensor 130 may be conventional devices that are typically employed in HVAC systems. The circulation fan 120 is sometimes referred to as an indoor air blower. In some embodiments, the temperature sensor 130 and the HVAC controller 150 are a single HVAC device.

As illustrated in FIG. 1, the HVAC controller 150 is coupled to the various components of the HVAC system 100. The connections can be conventional wired or wireless connections. The HVAC controller 150 may include a processor, such as a microprocessor, configured to direct the operation of the HVAC system 100. Additionally, the HVAC controller 150 may include an interface, a memory coupled thereto and a display. The interface may include multiple ports for transmitting and receiving external data and data from at least other components or devices of the HVAC system 100, such as the cooling system 110, the heating system 115 and the circulation fan 120. The memory may be a conventional memory that is constructed to store data and computer programs. The display can also be a conventional display that provides information to the user.

Figure 3:
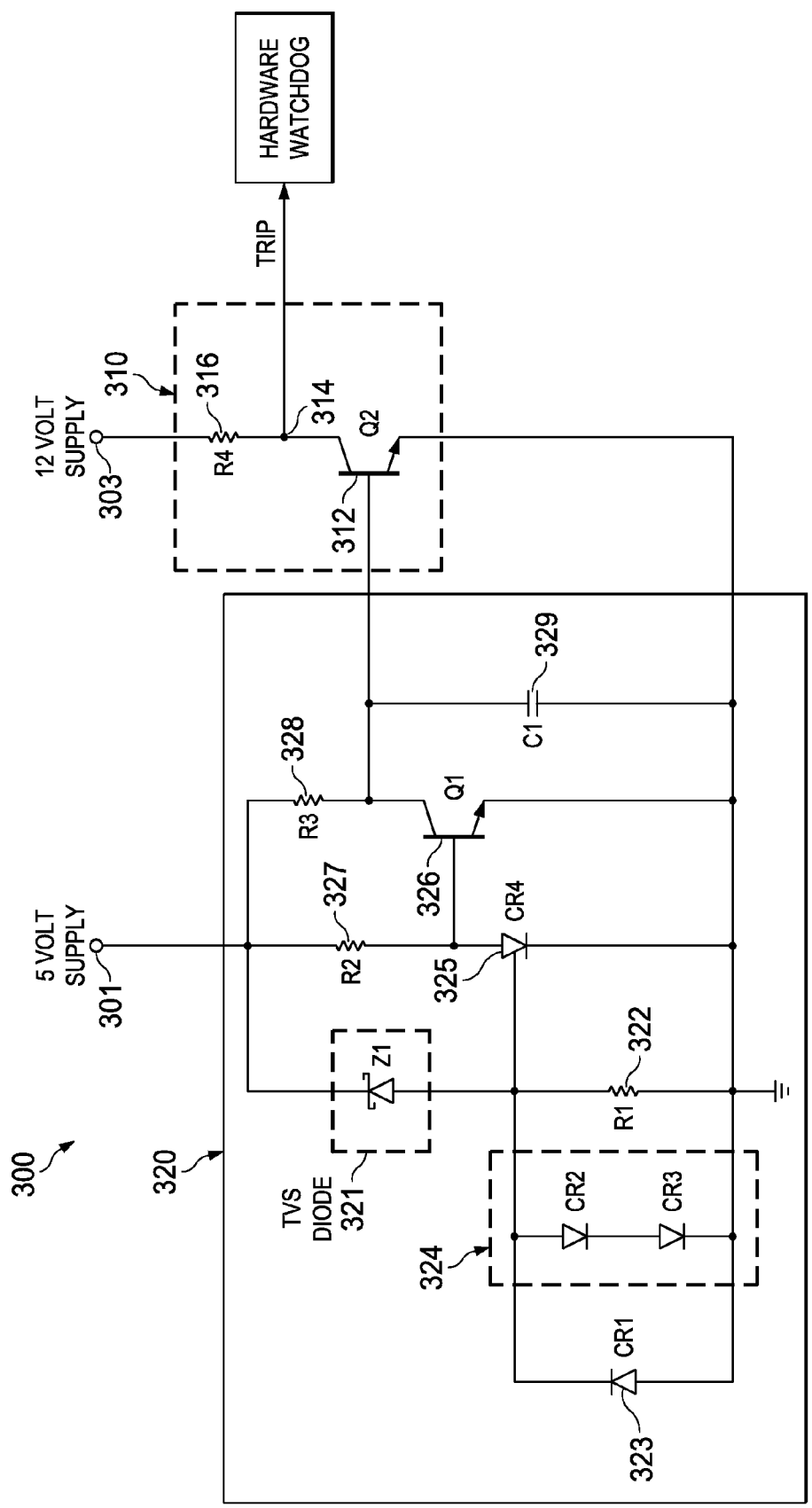
FIG. 3 illustrates a schematic diagram of an embodiment of an overvoltage recovery circuit (ORC) constructed according to the principles of the disclosure.

The HVAC controller 150 also includes an ORC 154. The ORC 154 is configured to reset or initiate a reset of a component of the HVAC controller 150 after an overvoltage event. An overvoltage event is the occurrence of a voltage in an electrical circuit that is above the upper design limit thereof. The circuit can be part of a device or component or can be a circuit that is connected to a device or component, such as a supply voltage circuit. A reset of a device or component after an overvoltage event is typically needed to place the component in proper operating states. A component, for example, can be a user interface such as a display. The ORC 154 includes interruption circuitry, detection circuitry, and at least two different terminals that receive supply voltages. The interruption circuitry is configured to provide a trip signal to reset a device or devices after an overvoltage event. The detection circuitry is configured to determine the occurrence of an overvoltage event and indicate the occurrence to the interruption circuitry. In one embodiment, the detection circuitry is located proximate the supply voltage that is provided for the device or devices. During an overvoltage event, one of the supply voltages continues to power the interruption circuitry. FIG. 3 provides additional information of the configuration of an ORC as disclosed herein.

Figure 2:
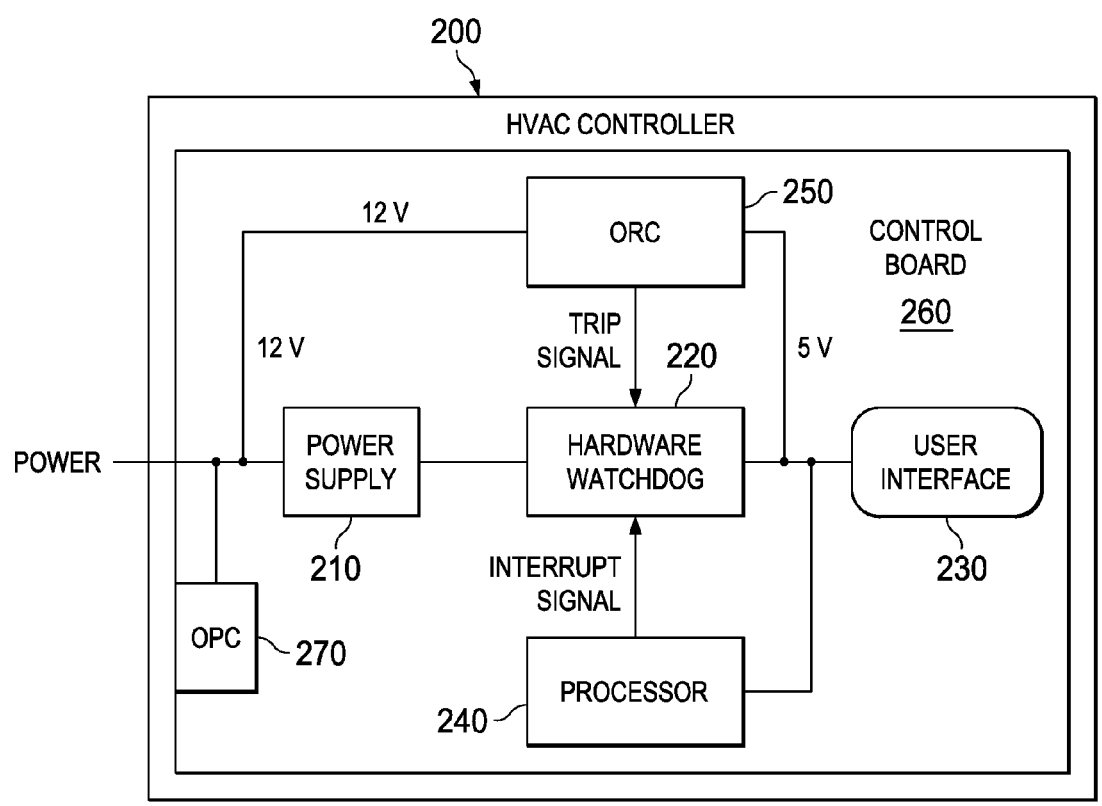
FIG. 2 illustrates a block diagram of an embodiment of a controller constructed according to the principles of the disclosure.

Turning now to FIG. 2 illustrated is a block diagram of an embodiment of HVAC controller 200 constructed according to the principles of the disclosure. The HVAC controller 200 is configured to direct the operation of, or at least part of, an HVAC system. The HVAC controller 200 includes a power supply 210, a hardware watchdog 220, a user interface 230, a processor 240 and an ORC 250. In one embodiment, each of these components is located on a single control board as denoted by the control board 260. The control board can be a general purpose control board for an HVAC system, such as the HVAC system 100. Each of the components of the HVAC controller 200 can be connected together via conventional means. One skilled in the art will understand that the HVAC controller 200 can include additional components typically included with a controller of an HVAC system. The HVAC controller 200 can include multiple circuit boards with each board having their own ORC. One skilled in the art will understand that the HVAC controller 200 can include additional components that are typically included in HVAC controllers, such as a communications interface for receiving and transmitting operating data of the HVAC system and a memory that is constructed to store data and computer programs.

The power supply 210, the hardware watchdog 220, the user interface 230 and the processor 240 can be conventional components typically included in an HVAC controller 200. For example, the power supply 210 may be an electronic power supply that employs a regulator to provide a DC or DC voltages. In some embodiments, the HVAC controller 200 and/or the control board 260 includes multiple power supplies. In the illustrated embodiment, the power supply 210 provides a twelve volt DC supply voltage to the ORC 250 and a five volt DC supply voltage to the hardware watchdog 220. The user interface 230, the processor 240 and the ORC 250 receive the five volt DC supply from the hardware watchdog 220. The processor 240 may be a microprocessor. As indicated in FIG. 2, the processor 240 generates an interrupt signal that is sent to the hardware watchdog 220. The hardware watchdog 220 operates as a conventional hardware watchdog and resets the processor 240 in response to receiving the interrupt signal by interrupting the five volt DC supply voltage to the processor 240.

Unlike the processor 240, the user interface 230 does not generate an interrupt signal when a reset is needed. For example, an overvoltage event could occur on circuitry of the control board 260 that affects the user interface 230 but does not cause the processor 240 to generate an interrupt signal. In these circumstances without the ORC 250, a manual reset of the user interface 230 would be needed to return the user interface 230 to normal operation. Instead of or in addition to the user interface 230, other resettable devices can employ the ORC 250.

The ORC 250 is configured to provide a trip signal to the hardware watchdog 220 in response to detecting an overvoltage condition. In one embodiment, the overvoltage condition is on the supply line for the user interface 230. In response to receiving the trip signal from the ORC 250, the hardware watchdog 220 interrupts the power supply to the user interface 230. In one embodiment, all of the devices on the supply line from the hardware watchdog 220 with overvoltage detection shall experience a momentary power interruption, thus resetting the devices back to a known state. This includes the processor 240. The user interface 230, therefore, is automatically reset instead of having to be manually reset. The user interface 230 is an example of one such device that can benefit from the ORC 250. The reset initiates a power-up of the user interface 230 that establishes a proper starting state. Thus, the user interface 230 can be reset even without the processor 240 generating an interrupt signal.

The HVAC controller 200 can also include an overvoltage protection circuit (OPC), such as OPC 270. In some embodiments, the OPC 270 is located proximate possible entry points of an overvoltage on the control board 270. For example, the OPC 270 can be an ESD protection circuit that is located proximate to possible ESD entry points on the control board 260.

FIG. 3 illustrates a schematic diagram of an embodiment of an ORC 300 constructed according to the principles of the disclosure. The ORC 300 includes a first supply voltage terminal 301 that is connected to a first voltage supply and a second supply voltage terminal 303 that is connected to a second voltage supply. In one embodiment, the first voltage supply and the second voltage supply are different voltages. For example, the first voltage supply is five volts and the second voltage supply is 12 volts.

The ORC 300 also includes interruption circuitry 310 and detection circuitry 320. The interruption circuitry 310 includes a switch 312, a trip terminal 314 and a fourth resistor R4 316 connected in series to the second supply voltage terminal 303. The interruption circuitry 310 is configured to provide a trip signal at the trip terminal 314 that initiates or causes an interruption of the first supply voltage to the first supply voltage terminal 301.

The detection circuitry 320 includes a diode (Z1) 321 that is connected to the first supply voltage terminal 301. The detection circuitry 320 also includes an undervoltage protection circuit 323 connected in series to the diode 321 and a high voltage protection circuit 324. The high voltage protection circuit 324 is connected in series with the diode 321 and in parallel with the undervoltage protection circuit 323.

The detection circuitry 320 further includes a Silicon Controlled Rectifier (SCR) 325, a switch Q1 326, a second resistor R2 327 and a third resistor R3 328. The SCR 325 is connected to the first supply voltage terminal 301 via the second resistor R2 327. The switch Q1 326 is connected in series to the third resistor R3 328 and is controlled by the SCR 325. The switch Q2 312 of the interruption circuitry 310 operates in response to an overvoltage condition at the first supply voltage terminal 301 of the detection circuitry 320. In one embodiment, the diode 321 is a unidirectional transient-voltage-suppression diode.

During normal operation of the ORC 300, the first supply voltage is at the first supply voltage terminal 301 and the diode 321 is non-conductive. Since the diode 321 is non-conductive, there is zero voltage at the junction between a first resistor R1 322 of the detection circuitry 320 and the diode 321. Accordingly, there is no drive on the SCR 325 and the ORC 300 is stable. Switch Q1 326 is on which causes switch Q2 312 to be off. With switch Q2 312 off there is a high voltage at trip terminal 314 from the second supply voltage at the second supply voltage terminal 303. The high trip signal is provided to a hardware watchdog, such as the hardware watchdog 220.

When an overvoltage condition occurs at the first supply terminal 301, diode 321 goes into conduction that causes current to flow across the first resistor R1 322. This creates a voltage at the junction between diode 321 and the first resistor R1 322. This voltage provides a control signal for the SCR 325. When the voltage of the control signal is adequate, the SCR 325 fires and latches in conduction. The SCR 325 stays in conduction as long as there is current flowing, i.e., as long as there is supply voltage at resistor R2 327. When SCR 325 goes into conduction, the bias voltage of switch Q1 326 is clamped off. Switch Q1 326 then goes out of conduction releasing the collector of switch Q1 326 and the voltage at the junction of switch Q1 326 and switch Q2 goes high, back to the supply voltage, that forward biases the base of switch Q2 312, causing switch Q2 312 into conduction. Therefore the trip voltage is taken to a low voltage forcing a coupled hardware watchdog to reset the components connected thereto. For example, forcing a display, such as the user interface 230 to reset. Additionally, the first supply voltage is interrupted by the hardware watchdog via the trip signal. In one embodiment, the five volt supply voltage is interrupted for 200 milliseconds.

With the first supply voltage interrupted, there is no longer a current source for the SCR 325 and it drops out of conduction. When power returns to the five volt supply, capacitor 329, connected in parallel to switch 326, prevents switch 312 from immediately going into conduction. This allows the detection circuitry 320 a sufficient amount of time to establish a stable state.

When the current source for SCR 325 goes away and the first supply voltage then comes back on, normal state for the detection circuitry 320 is returned. Switch Q2 312 is not conducting and the trip signal allows the connected hardware watchdog to function normally.

In the illustrated embodiment, the high voltage protection circuit 324 includes two diodes, CR2 and CR3, and the undervoltage protection circuit 323 includes a single diode CR1. The high voltage protection circuit 324 prevents a high voltage, a two diode drop, to get to the gate of the SCR 325. The undervoltage protection circuit 323 protects against low voltage by shunting a negative voltage to ground.

The size, operating parameters and characteristics of the various components of the ORC 300 varies depending on the application. Additionally, the inverse of the various generated signals discussed above can be used in different embodiments. For example, the trip signal use to initiate resets can be a low signal in some embodiments. Those skilled in the art to which this application relates will also appreciate that other and further additions, deletions, substitutions and modifications may be made to the described embodiments.

What is claimed is:

1. An overvoltage recovery circuit (ORC), comprising:
   a first supply voltage terminal connected to a first voltage supply;
   a second supply voltage terminal connected to a second voltage supply;
   interruption circuitry including a switch and a trip terminal connected to said second supply voltage terminal;
   detection circuitry connected to said first supply voltage terminal and said switch of said interruption circuitry, said detection circuitry configured to operate said switch in response to an overvoltage condition at said first supply voltage terminal; and
   wherein said detection circuitry comprises a switch and a silicon controlled rectifier connected to said first supply voltage terminal, wherein said silicon controlled rectifier controls operation of said switch.

2. The ORC as recited in claim 1 wherein said interruption circuitry is configured to provide a trip signal at said trip terminal in response to said operation of said switch.

3. The ORC as recited in claim 2 wherein said trip signal initiates an interruption of said first supply voltage to said first supply voltage terminal.

4. The ORC as recited in claim 1 wherein said detection circuitry includes a unidirectional transient-voltage-suppression diode connected to said first supply voltage suppression terminal.

5. The ORC as recited in claim 4 wherein said detection circuitry includes an undervoltage protection device connected in series to said unidirectional transient-voltage-suppression diode.

6. The ORC as recited in claim 5 wherein said detection circuitry includes an overvoltage protection device connected in series with said unidirectional transient-voltage-suppression diode and in parallel with said undervoltage protection device.

7. A controller for a heating, ventilating and air conditioning (HVAC) system, comprising:
   a power supply;
   a hardware watchdog coupled to said power supply; and
   an overvoltage recovery circuit (ORC) connected to said power supply, said ORC including:
      a first supply voltage terminal connected to a first voltage supply;
      a second supply voltage terminal connected to a second voltage supply;
      interruption circuitry including a switch and a trip terminal connected to said second supply voltage terminal;
      detection circuitry connected to said first supply voltage terminal and said switch of said interruption circuitry, said detection circuitry configured to operate said switch in response to an overvoltage condition at said first supply voltage terminal;
      wherein said interruption circuitry is configured to provide a trip signal at said trip terminal in response to said operation of said switch, wherein said trip signal initiates an interruption of said first supply voltage to said first supply voltage terminal; and
      wherein said hardware watchdog receives said trip signal and said hardware watchdog interrupts supply of said first supply voltage to said first supply voltage terminal.

8. The controller as recited in claim 7 further comprising a user interface connected to said ORC and said power supply via said hardware watchdog, wherein said trip signal initiates a reset of said user interface.

9. The controller as recited in claim 7 further comprising a processor connected to said hardware watchdog and said user interface, said controller configured to direct operation of said HVAC system.

10. The controller as recited in claim 9 wherein said power supply provides said first voltage supply and said second voltage supply.

11. A heating, ventilating and air conditioning (HVAC) system, comprising:
   a heating source or a cooling source; and
   an HVAC controller configured to direct operation of said heating source or said cooling source, said HVAC controller including:
      a processor configured to provide control signals for components of said HVAC system and provide an interrupt signal to initiate a reset thereof;
      a hardware watchdog configured to receive said interrupt signal from said processor and interrupt power to said processor in response thereof; and
      an overvoltage recovery circuit (ORC) including:
         a first supply voltage terminal connected to a first voltage supply;
         a second supply voltage terminal connected to a second voltage supply;
         interruption circuitry including a switch and a trip terminal connected to said second supply voltage terminal; and
         detection circuitry connected to said first supply voltage terminal and said switch of said interruption circuitry, said detection circuitry configured to operate said switch in response to an overvoltage condition at said first supply voltage terminal.

12. The HVAC system as recited in claim 11 wherein said interruption circuitry is configured to provide a trip signal at said trip terminal in response to said operation of said switch, wherein said trip signal initiates an interruption of said first supply voltage to said first supply voltage terminal.

13. The HVAC system as recited in claim 12 wherein said hardware watchdog is further configured to receive said trip signal and, based thereon, interrupt supply of said first supply voltage to said first supply voltage terminal.

14. The HVAC system as recited in claim 12 wherein said controller further includes a user interface connected to said ORC and said power supply via said hardware watchdog, wherein said trip signal initiates a reset of said user interface.

15. The HVAC system as recited in claim 11 wherein said controller further includes a power supply configured to provide said first voltage supply and said second voltage supply.

16. The HVAC system as recited in claim 11 wherein said hardware watchdog is connected to said trip terminal and is configured to interrupt said first supply voltage in response to said overvoltage condition.

* * * * *